United States Patent
Tominaga et al.

(10) Patent No.: US 11,208,009 B2
(45) Date of Patent: Dec. 28, 2021

(54) ELECTRICAL APPARATUS

(71) Applicant: HONDA MOTOR CO., LTD., Tokyo (JP)

(72) Inventors: Takuro Tominaga, Saitama (JP); Takanori Suzuki, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 319 days.

(21) Appl. No.: 16/577,638

(22) Filed: Sep. 20, 2019

(65) Prior Publication Data
US 2020/0101813 A1    Apr. 2, 2020

(30) Foreign Application Priority Data
Oct. 2, 2018    (JP) .............................. JP2018-187589

(51) Int. Cl.
   *B60L 58/26*       (2019.01)
   *H05K 7/20*        (2006.01)
               (Continued)

(52) U.S. Cl.
CPC .......... *B60L 58/26* (2019.02); *B60H 1/00271* (2013.01); *B60H 1/00428* (2013.01);
(Continued)

(58) Field of Classification Search
None
See application file for complete search history.

(56) References Cited

U.S. PATENT DOCUMENTS 6,404,628 B1 *   6/2002   Nagashima ........ H05K 7/20927
                                                              165/104.33
2010/0025126 A1    2/2010   Nakatsu et al.
(Continued)

FOREIGN PATENT DOCUMENTS

JP      H07-288950 A    10/1995
JP      2005-123265 A    5/2005
(Continued)

OTHER PUBLICATIONS

Jun. 9, 2020, Japanese Office Action issued for related JP application No. 2018-187589.

*Primary Examiner* — Jared Fureman
*Assistant Examiner* — Joel Barnett
(74) *Attorney, Agent, or Firm* — Paratus Law Group, PLLC (57) ABSTRACT

A vehicle includes an electrical apparatus comprising an electric circuit unit, a cooling unit that cools the electric circuit unit, a housing that accommodates the electric circuit unit and the cooling unit, a refrigerant introduction unit that supplies a refrigerant to the cooling unit; and a refrigerant discharge unit that discharges the refrigerant from the cooling unit. The refrigerant introduction unit and the refrigerant discharge unit are provided on opposite sides with the electric circuit unit being interposed therebetween in a horizontal direction. The housing is provided, on an inner side of an outer edge of the housing, with a connector connecting portion that is connected to a connector, and the connector connecting portion is provided below the cooling unit and closer to the refrigerant introduction unit or to the refrigerant discharge unit than the electric circuit unit in the horizontal direction.

6 Claims, 9 Drawing Sheets

(51) Int. Cl.
 B60H 1/22 (2006.01)
 B60H 1/00 (2006.01)
 H01L 23/473 (2006.01)

(52) U.S. Cl.
 CPC ..... B60H 1/00528 (2013.01); B60H 1/00535 (2013.01); H01L 23/473 (2013.01); H05K 7/20927 (2013.01); *B60H 2001/2278* (2013.01)

(56) References Cited

U.S. PATENT DOCUMENTS

| | | |
|---|---|---|
| 2012/0275205 A1 | 11/2012 | Nakatsu et al. |
| 2013/0128645 A1 | 5/2013 | Nakatsu et al. |
| 2014/0116771 A1 | 5/2014 | Masuda et al. |
| 2015/0022974 A1 | 1/2015 | Nakatsu et al. |
| 2015/0246619 A1* | 9/2015 | Nagao ................ H05K 7/20927 307/10.1 |
| 2015/0289391 A1 | 10/2015 | Nakatsu et al. |
| 2017/0127561 A1* | 5/2017 | You .................... H05K 7/20927 |
| 2018/0124935 A1 | 5/2018 | Nakatsu et al. |
| 2019/0098777 A1 | 3/2019 | Nakatsu et al. |
| 2019/0254182 A1 | 8/2019 | Nakatsu et al. |

FOREIGN PATENT DOCUMENTS

| | | |
|---|---|---|
| JP | 2007-099239 A | 4/2007 |
| JP | 2010-035347 A | 2/2010 |
| JP | 2014-093379 A | 5/2014 |
| JP | 2015-164367 A | 9/2015 |
| JP | 2015-204688 A | 11/2015 |
| KR | 10-2014-0118601 A | 10/2014 |
| WO | WO 2013-080665 A1 | 6/2013 |

\* cited by examiner

ELECTRICAL APPARATUS

CROSS-REFERENCE TO RELATED APPLICATIONS

This application is based on and claims priority under 35 USC 119 from Japanese Patent Application No. 2018-187589 filed on Oct. 2, 2018.

TECHNICAL FIELD

The present invention relates to an electrical apparatus provided with a connector connecting portion to which a connector is connected.

BACKGROUND ART

In the electrical apparatus of JP-A-2014-93379, a connector connecting portion bulges out from a side surface of a housing and a eave portion protruding from an upper end portion of the housing is provided above the connector connecting portion, so that the connector connecting portion is prevented from being flooded.

However, in JP-A-2014-93379, since the connector connecting portion bulges out from the side surface of the housing, the size of the electrical apparatus is increased, and since the eave portion is provided thereon, the size of the electrical apparatus is further increased. In addition, if the connector connecting portion bulges out from the side surface of the housing, there is a possibility that external impact may be directly input to the connector connecting portion.

SUMMARY

An aspect of the present invention provides an electrical apparatus capable of protecting a connector connecting portion from external impact while reducing the size of the electrical apparatus.

An embodiment of the present invention relates to an electrical apparatus which includes:
an electric circuit unit;
a cooling unit that cools the electric circuit unit;
a housing that accommodates the electric circuit unit and the cooling unit;
a refrigerant introduction unit that supplies a refrigerant to the cooling unit; and
a refrigerant discharge unit that discharges the refrigerant from the cooling unit,
wherein the refrigerant introduction unit and the refrigerant discharge unit are provided on opposite sides with the electric circuit unit being interposed therebetween in a horizontal direction,
wherein the housing is provided, on an inner side of an outer edge of the housing, with a connector connecting portion that is connected to a connector, and
wherein the connector connecting portion is provided below the cooling unit and closer to the refrigerant introduction unit or to the refrigerant discharge unit than the electric circuit unit in the horizontal direction.

Advantageous Effects of Invention

According to the above embodiment of the present invention, the connector connecting portion is disposed on the inner side of the outer edge of the housing, below the cooling unit, and closer to the refrigerant introduction unit or to the refrigerant discharge unit than the electric circuit unit, so that a space that does not interfere with the electric circuit unit can be used efficiently while ensuring a large space for the electric circuit unit. Therefore, the connector connecting portion can be protected from external impact while reducing the size of the electrical apparatus.

DESCRIPTION OF EMBODIMENTS

An electrical apparatus according to an embodiment of the present invention will be described below using an electrical apparatus mounted on a vehicle as an example with reference to the drawings. The drawings should be seen based on a direction of reference numerals. In the following description, front, rear, left, right, upper, and lower directions are described according a view from an operator of the vehicle. In the drawings, a front side of the vehicle is denoted by Fr, a rear side is denoted by Rr, a left side is denoted by L, a right side is denoted by R, an upper side is denoted by U, and a lower side is denoted by D.

[Overall Structure of Vehicle]

Figure 1:
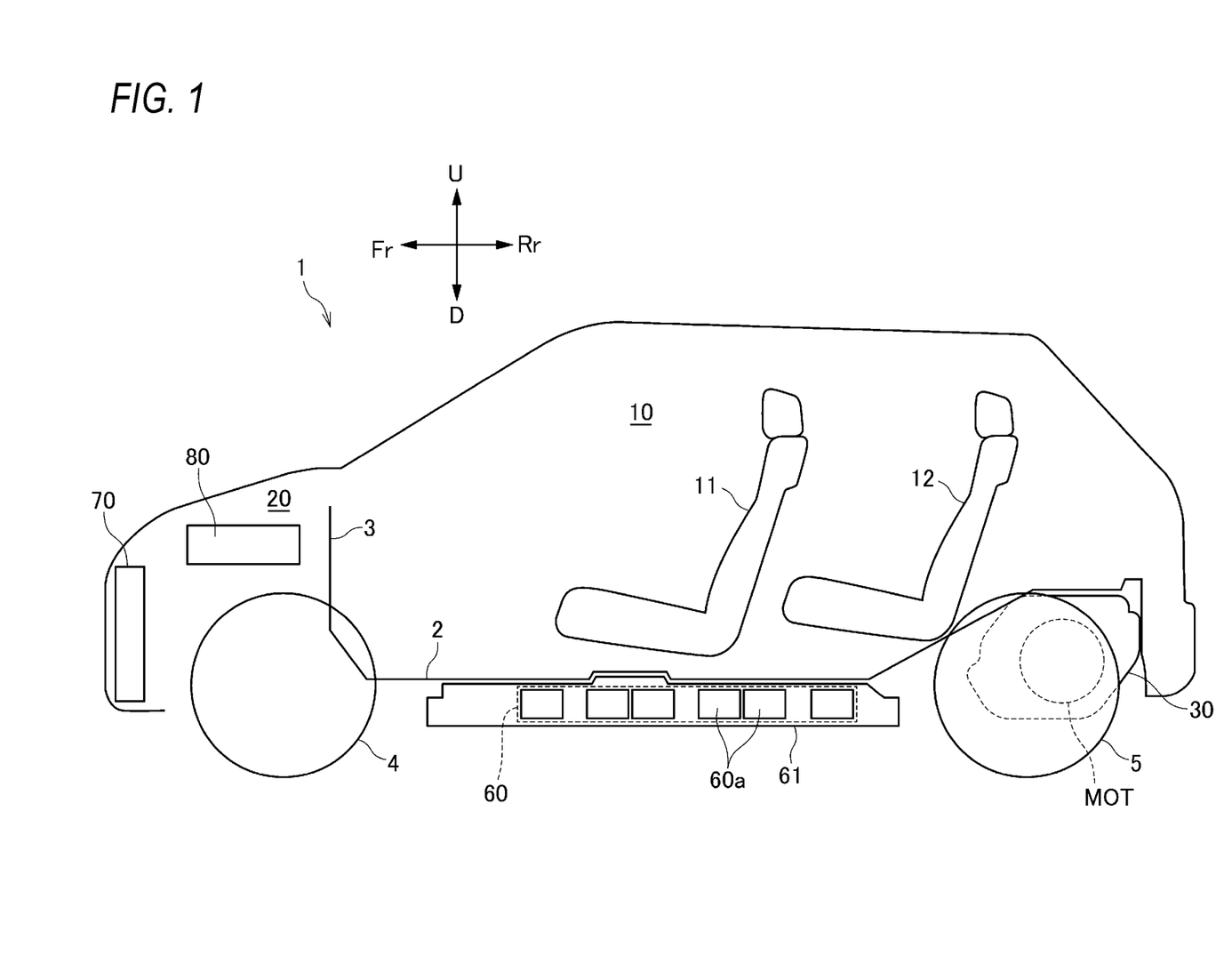
FIG. 1 is a schematic side view showing an overall structure of a vehicle including an electrical apparatus according to an embodiment of the present invention.
Figure 2:
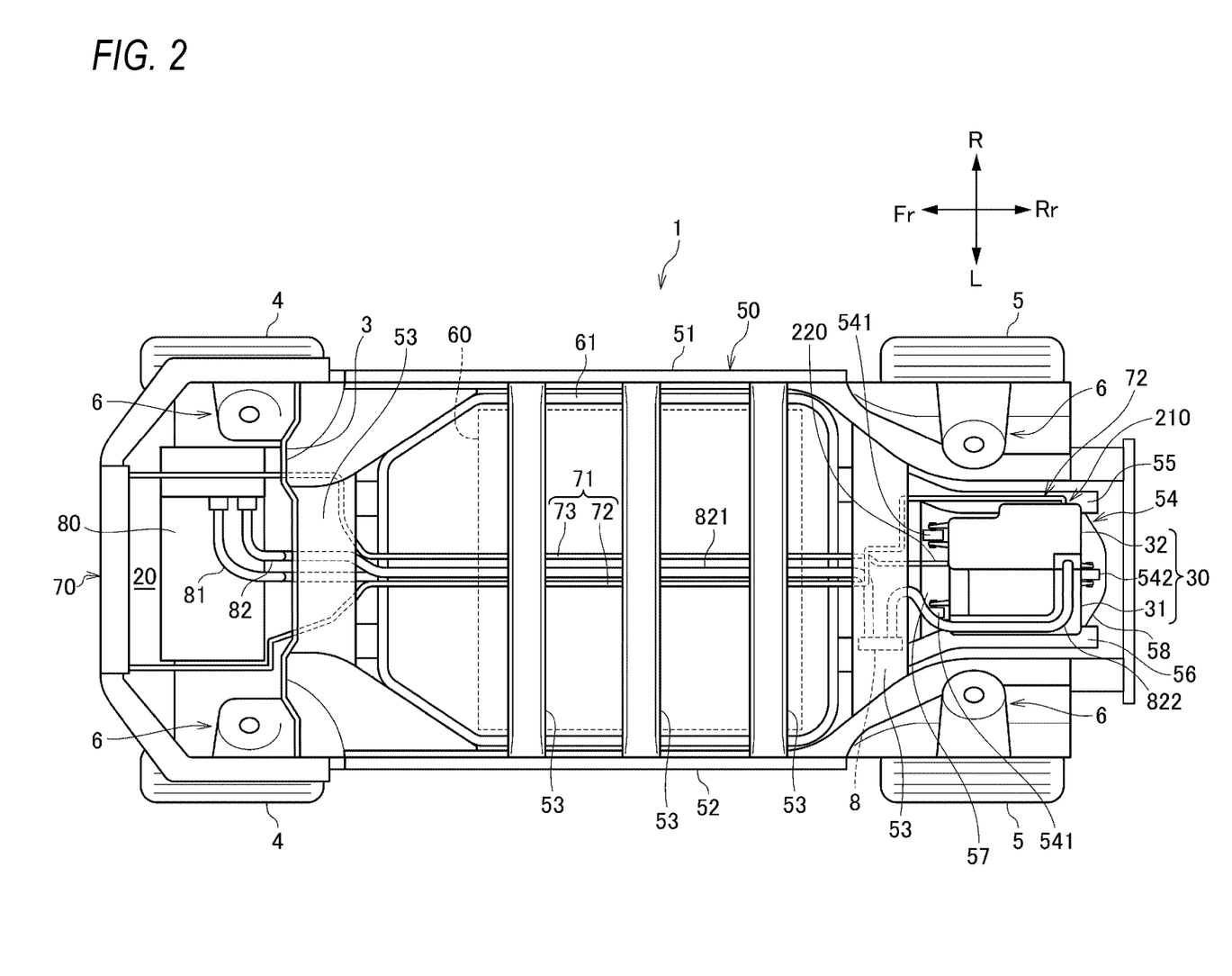
FIG. 2 is a plan view showing an underfloor structure of the vehicle of FIG. 1.

As shown in FIGS. 1 and 2, a vehicle 1 is formed by a vehicle interior 10 and a front room 20 in front of the vehicle interior 10, which are defined by a floor panel 2 and a dash panel 3. Front seats 11 and rear seats 12 are provided in the vehicle interior 10. A driving device unit 30 is provided below the floor panel 2 behind the rear seat 12. The drive device unit 30 drives left and right rear wheels 5. That is, in the vehicle 1, the left and right rear wheels 5 are driving wheels, and left and right front wheels 4 are driven wheels. The front wheels 4 and the rear wheels 5 are supported by a vehicle body frame 50 via suspensions (not shown) supported by respective suspension support portions 6.

A battery 60 including a plurality of battery modules 60a is disposed below the vehicle interior 10. The battery 60 is accommodated in a battery case 61 and disposed below the floor panel 2.

Figure 9:
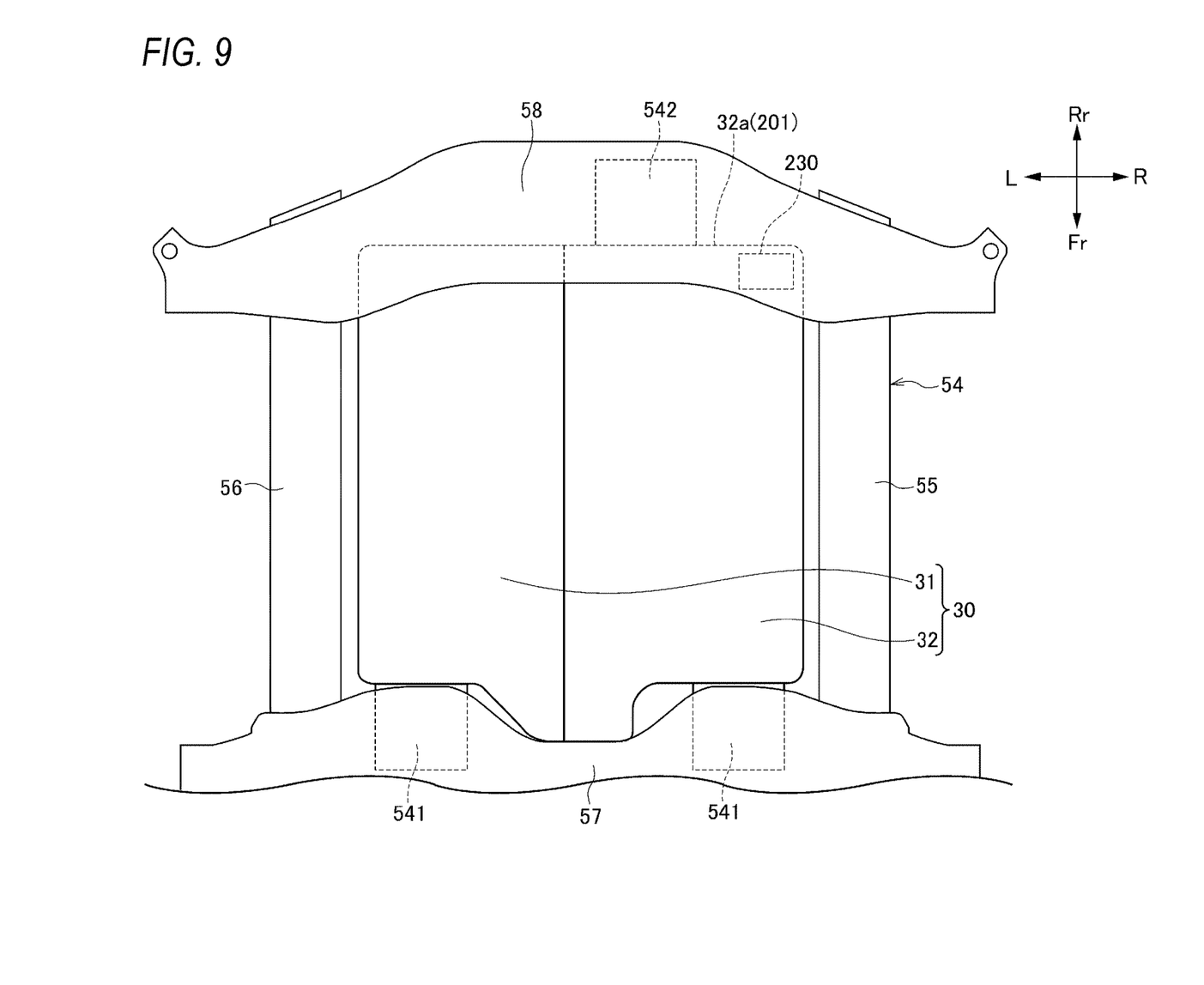
FIG. 9 is a bottom view of the electrical apparatus in the vehicle of FIG. 1.

The vehicle body frame 50 includes a pair of left and right side members 51, 52 extending in a front-rear direction, a plurality of cross members 53 extending in a left-right direction and connecting the side members 51, 52, and a sub-frame 54 having a rectangular shape so as to surround the driving device unit 30. As also shown in FIG. 9, the sub-frame 54 includes a pair of sub-side members 55, 56 supported by the pair of side members 51, 52, and a front frame member 57 and a rear frame member 58 that connect the pair of sub-side members 55, 56. The driving device unit 30 includes a drive device 31 which accommodates a motor MOT as an electric motor, and a power control unit (PCU) 32 as an electrical apparatus configured to control the motor MOT. The driving device 31 and the PCU 32 are electrically connected via a bus bar (not shown).

The front room 20 is provided with a cooling device 70 for cooling the PCU 32. The cooling device 70 includes a radiator provided at a forefront of the vehicle 1. The cooling device 70 and the PCU 32 are connected by cooling pipes 71. The cooling pipes 71 are disposed between the floor panel 2 and the battery 60 (battery case 61). The cooling pipes 71 include a first cooling pipe 72 configured to supply a refrigerant from the cooling device 70 to the PCU 32, and a second cooling pipe 73 configured to discharge the refrigerant from the PCU 32 to the cooling device 70.

Figure 3:
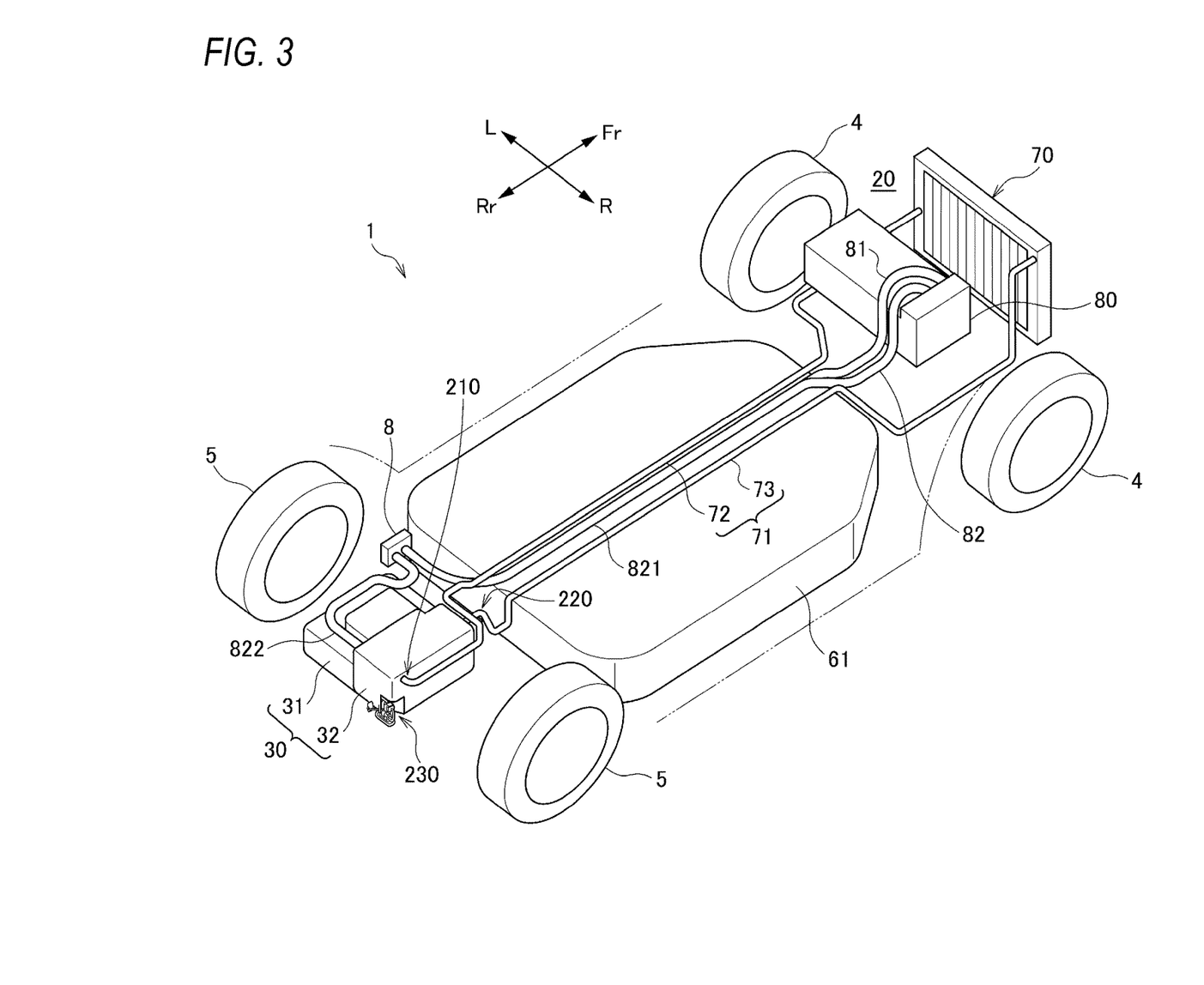
FIG. 3 is a perspective view showing cooling pipes or the like of the vehicle of FIG. 1.

As shown in FIGS. 1 to 3, a junction box 80, which is connected to a charging port (not shown) that is provided at an upper portion of a front end of the vehicle 1, is disposed in the front room 20. The junction box 80 is connected to the battery 60 via a battery cable 81, and connected to the PCU 32 via a PCU cable 82. The PCU cable 82 includes a first cable 821 extending from the junction box 80 and a second cable 822 extending from the PCU 32. The first cable 821 and the second cable 822 are connected to each other via a joint box 8 fixed to a lower surface of the cross member 53 located between the battery 60 and the driving device unit 30.

As shown in FIGS. 2 and 3, the first cable 821 of the PCU cable 82 is disposed between the first cooling pipe 72 and the second cooling pipe 73. As described above, the first cooling pipe 72 and the second cooling pipe 73 are disposed on both sides of the PCU cable 82, so that heat generation of the PCU cable 82 can be suppressed. In addition to the first cooling pipe 72 and the second cooling pipe 73, the PCU cable 82 is also protected from bounced stones or the like by being disposed between the floor panel 2 and the battery 60.

As shown in FIG. 2, the driving device unit 30 is fixed to a front frame member 57 via a pair of front mounting portions 541, and is fixed to a rear frame member 58 via a rear mounting portions 542. The drive device 31 is provided with the motor MOT and a transmission (not shown), and torque of the motor MOT is transmitted to an output shaft (not shown) via the transmission, and is transmitted from the output shaft (not shown) to the rear wheels 5.

[PCU (Electrical Apparatus)]

As shown in FIGS. 2 to 8, the PCU 32 is, for example, an inverter, and includes an electric circuit unit 90, a cooling unit 100 that cools the electric circuit unit 90, a housing 200 that accommodates the electric circuit unit 90 and the cooling unit 100, a refrigerant introduction unit 210 that supplies a refrigerant to the cooling unit 100, and a refrigerant discharge unit 220 that discharges the refrigerant from the cooling unit 100. The electric circuit unit 90 is mounted with electric elements such as a reactor, a capacitor, and a switching element.

The refrigerant introduction unit 210 is provided on a right surface of the housing 200. The first cooling pipe 72 is connected to the refrigerant introduction unit 210. The refrigerant discharge unit 220 is provided on a front surface of the housing 200.

Figure 8:
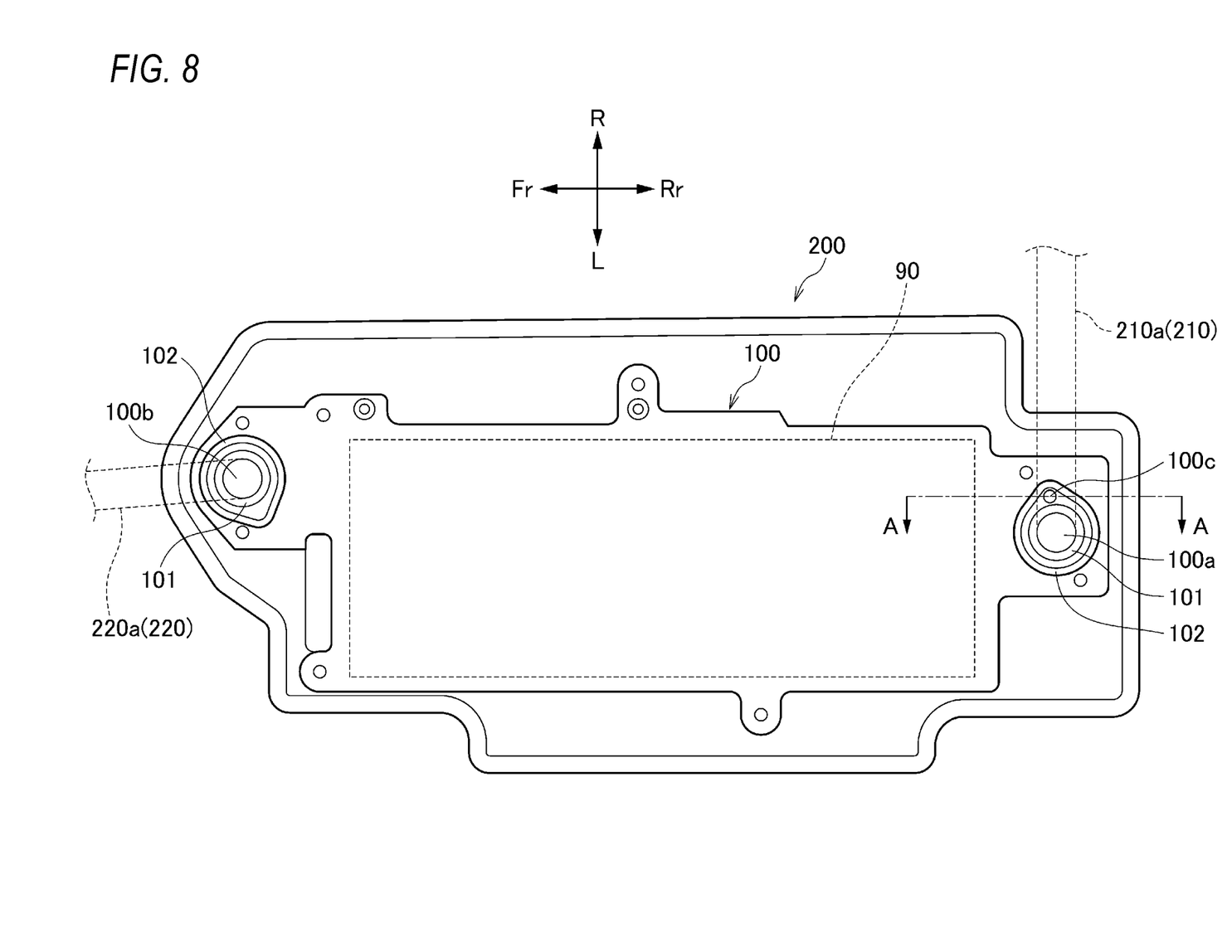
FIG. 8 is a plan view of a cooling unit of the electrical apparatus in FIG. 4.

As shown in FIG. 8, a refrigerant flow path 210a of the refrigerant introduction unit 210 is connected to a refrigerant inlet 100a of the cooling unit 100. A refrigerant flow path 220a of the refrigerant discharge unit 220 is connected to a refrigerant outlet 100b of the cooling unit 100. The refrigerant introduction unit 210 and the refrigerant discharge unit 220 are provided on opposite sides with the electric circuit unit 90 being interposed therebetween in the front-rear direction. As described above, the refrigerant introduction unit 210 and the refrigerant discharge unit 220 are provided on the opposite sides with the electric circuit unit 90 being interposed therebetween in the front-rear direction, so that the electric circuit unit 90 can be ensured widely.

As shown in FIGS. 4 to 7, the housing 200 is provided, on an inner side of an outer edge 201 of the housing 200, with a connector connecting portion 230 that is connected to a connector 400 provided at one end portion of the cable 83. Therefore, the connector connecting portion 230 can be protected from an external impact. A connector 300 at the other end portion of the cable 83 is connected to an apparatus different from the PCU 32, for example, an electrical apparatus such as the driving device 31 and an ECU.

The connector connecting portion 230 is provided below the cooling unit 100 and closer to the refrigerant introduction unit 210 than the electric circuit unit 90 in the front-rear direction. According to such a configuration, a space that does not interfere with the electric circuit unit 90 can be used efficiently while ensuring a large space for the electric circuit unit 90, and the size of the PCU 32 can be reduced.

The connector connecting portion 230 is disposed on a vertical wall 202 provided on the inner side than the outer edge 201 of the housing 200 so that a connecting surface 231 is directed rightward. According to such a configuration, the connector connecting portion 230 can also be protected from an impact from below.

Figure 7:
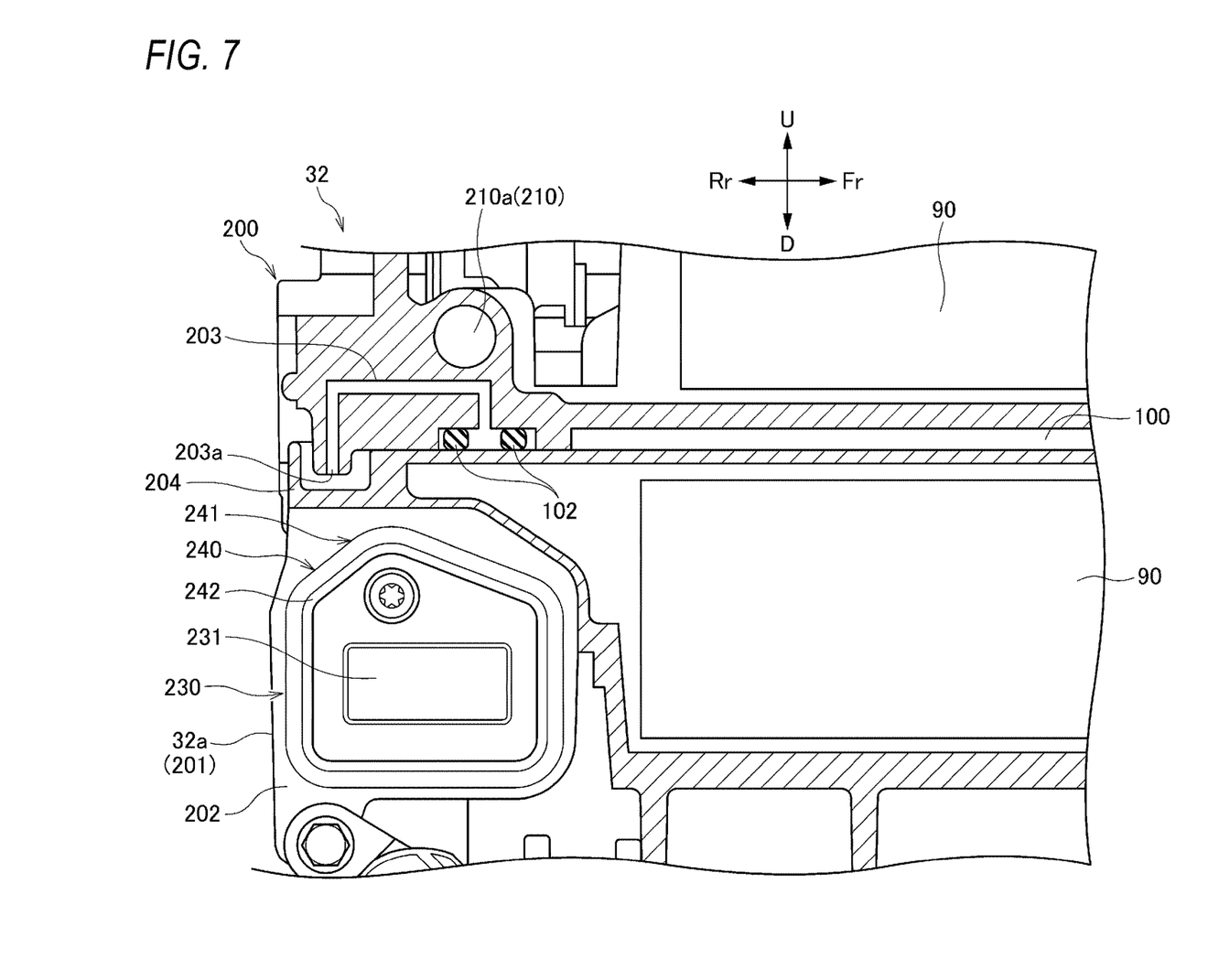
FIG. 7 is a cross-sectional view taken along a line A-A in FIGS. 6 and 8.

As shown in FIG. 8, seal portions 101, 102 as an inner-outer double structure are provided around the refrigerant inlet 100a and the refrigerant outlet 100b. The inner seal portion 101 is disposed so as to surround the refrigerant inlet 100a and the refrigerant outlet 100b, and the outer seal portion 102 is disposed so as to surround the inner seal portion 101 via a space 100c. As shown in FIG. 7, the space 100c between the seal portions 101, 102 of the refrigerant inlet 100a is connected to the outside of the housing 200 via a drain passage 203 provided inside the housing 200.

As shown in FIGS. 4 to 7, an eave-like gutter 204 is provided above the connector connecting portion 230. The gutter 204 does not protrude from a rear surface 32a of the housing 200 and does not constitute the outer edge 201 of the housing 200. The gutter 204 extends in the left-right direction. An outlet 203a of the drain passage 203 is opened above the gutter 204. According to the configuration, the refrigerant discharged from the outlet 203a is blocked from falling by the gutter 204 and guided in the left-right direction, and then falls from both left and right ends of the gutter 204 as shown by arrows W in FIG. 5 to avoid the connector connecting portion 230. Therefore, even if the inner seal portion 101 of the refrigerant introduction unit 210 breaks down and the refrigerant flows out of the housing 200 through the drain passage 203, the refrigerant can be prevented from flowing into the connector connecting portion 230.

As shown in FIG. 7, the housing 200 is provided with a connector accommodating portion 240 that accommodates the connector connecting portion 230. An upper portion 241 of the connector accommodating portion 240 has a convex shape that is convex upward. A seal portion 242 is provided between the connector connecting portion 230 and the connector accommodating portion 240. As described above, the upper portion 241 of the connector accommodating portion 240 has a convex shape that is convex upward, so that even if the refrigerant flows into the connector connecting portion 230, the refrigerant can be introduced away from the connecting surface 231 of the connector connecting portion 230. Further, the seal portion 242 is provided between the connector connecting portion 230 and the connector accommodating portion 240, so that the refrigerant can be prevented from entering the connector accommodating portion 240.

Figure 4:
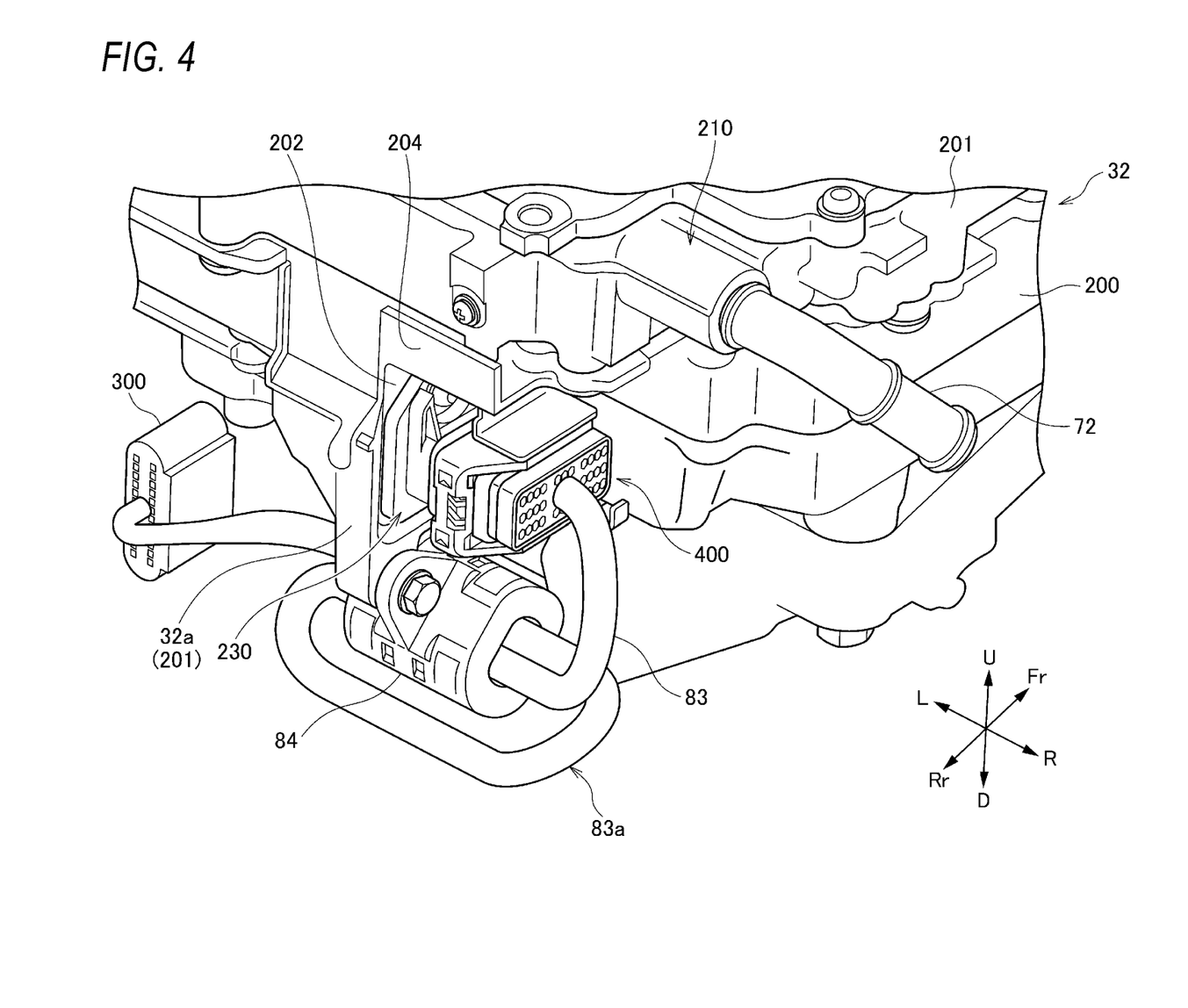
FIG. 4 is a perspective view of the electrical apparatus and the periphery thereof in the vehicle of FIG. 1.
Figure 5:
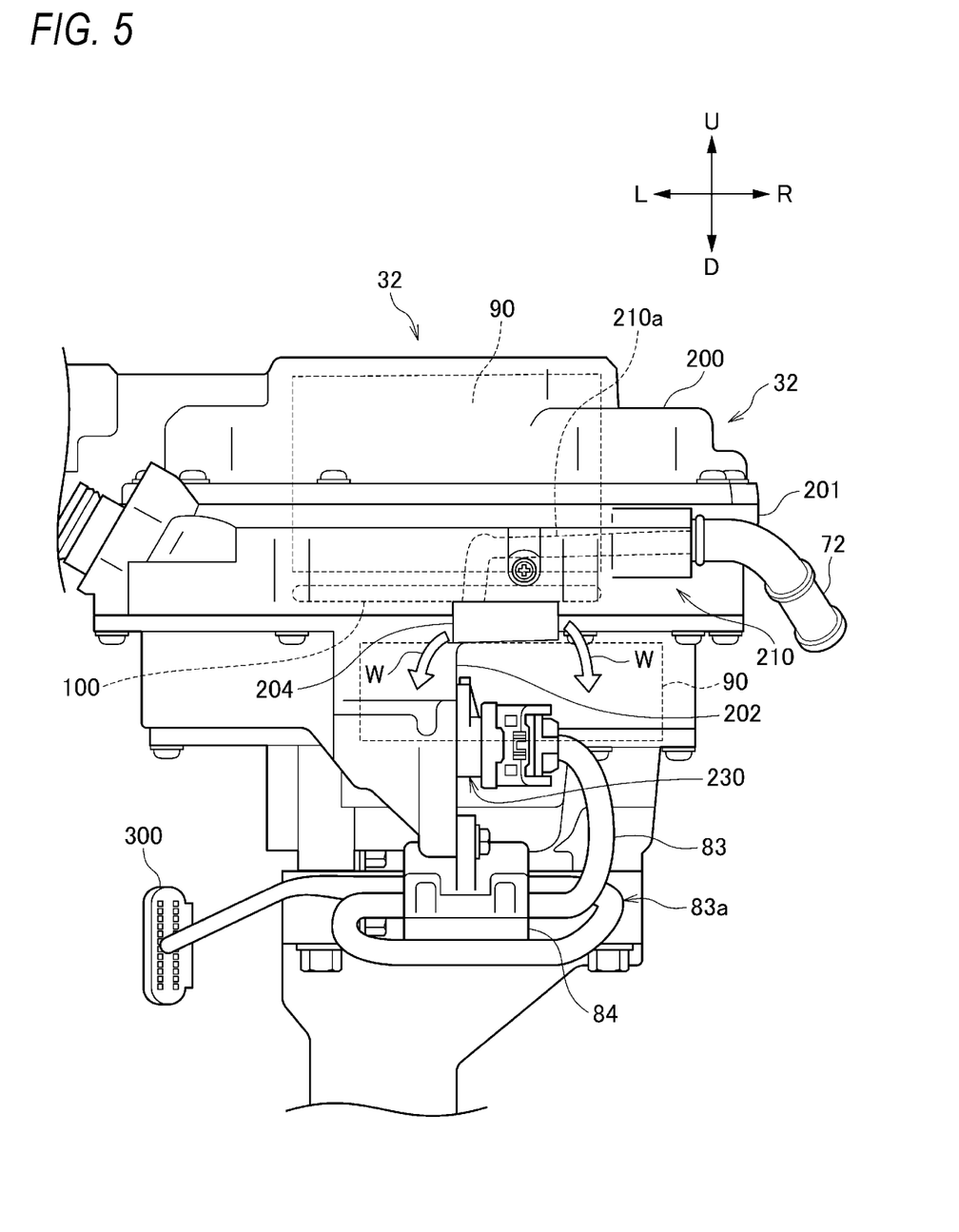
FIG. 5 is a side view of the electrical apparatus and the periphery thereof in FIG. 4.
Figure 6:
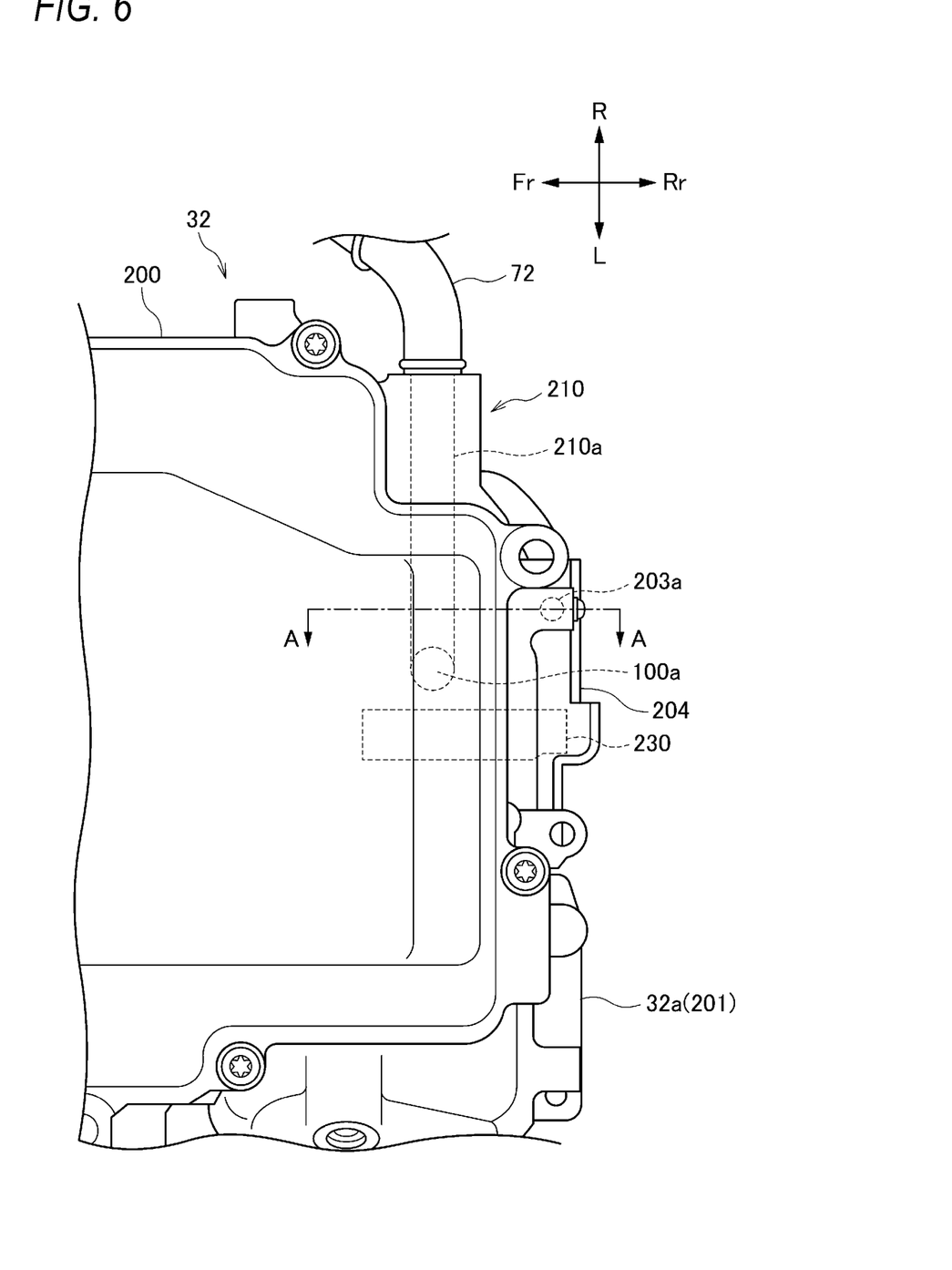
FIG. 6 is a plan view of the electrical apparatus and the periphery thereof in FIG. 4.

As shown in FIGS. 4 and 5, a turn portion 83a is formed in an intermediate part of the cable 83 connected to the connector connecting portion 230, and a ferrite core 84 is attached to the turn portion 83a. The ferrite core 84 is provided below the connector connecting portion 230. According to the configuration, the noise of the cable 83 can be reduced by the ferrite core 84 by effectively using the dead space provided below the connector connecting portion 230.

As shown in FIG. 9, the connector connecting portion 230 is covered with the rear frame member 58 of the sub-frame 54 in a bottom view. According to the configuration, an external impact is input to the sub-frame 54 before to the PCU 32, so that the connector connecting portion 230 can be protected from the impact. Further, the connector connecting portion 230 is located higher than the sub-frame 54, so that the connector connecting portion 230 can be protected from being flooded from below.

The above embodiment may be appropriately modified, improved, or the like. For example, the connector connecting portion 230 is provided below the refrigerant introduction unit 210 in the above embodiment, but the connector connecting portion 230 may also be provided below the refrigerant discharge unit 220. Further, the electrical apparatus of the present invention can be applied to in-vehicle electrical apparatuses other than the PCU 32, and may also be applied to non-in-vehicle electrical apparatuses.

At least the following matters are described in the present specification. Corresponding components in the above-described embodiments are shown in parentheses, without being limited thereto.

(1) An electrical apparatus (PCU 32) includes:
an electric circuit unit (electric circuit unit 90);
a cooling unit (cooling unit 100) that cools the electric circuit unit;
a housing (housing 200) that accommodates the electric circuit unit and the cooling unit;
a refrigerant introduction unit (refrigerant introduction unit 210) that supplies a refrigerant to the cooling unit; and
a refrigerant discharge unit (refrigerant discharge unit 220) that discharges the refrigerant from the cooling unit,
wherein the refrigerant introduction unit and the refrigerant discharge unit are provided on opposite sides with the electric circuit unit being interposed therebetween in a horizontal direction,
wherein the housing is provided, on an inner side of an outer edge (outer edge 201) of the housing, with a connector connecting portion (connector connecting portion 230) that is connected to a connector (connector 400), and
wherein the connector connecting portion is provided below the cooling unit and closer to the refrigerant introduction unit or to the refrigerant discharge unit than the electric circuit unit in the horizontal direction.

According to (1), the connector connecting portion is disposed on the inner side of the outer edge of the housing, below the cooling unit, and closer to the refrigerant introduction unit or to the refrigerant discharge unit than the electric circuit unit, so that a space that does not interfere with the electric circuit unit can be used efficiently while ensuring a large space for the electric circuit unit. Therefore, the connector connecting portion can be protected from external impact while reducing the size of the electrical apparatus. The horizontal direction of the present invention means a direction orthogonal to the upper-lower direction, and is not limited to the front-rear direction, but may also be the left-right direction or a direction inclined with respect to the front-rear direction and the left-right direction.

(2) In the electrical apparatus according to (1), the connector connecting portion is disposed on a vertical wall (vertical wall 202) provided on the inner side than the outer edge such that a connecting surface (connecting surface 231) is directed in the horizontal direction (rightward).

According to (2), the connector connecting portion is disposed on the vertical wall provided on the inner side than the outer edge of the housing so that the connecting surface is directed in the horizontal direction. Therefore, the connector connecting portion can be protected from an impact from below.

(3) In the electrical apparatus according to (2),
an outlet (outlet 203a) of a drain passage (drain passage 203), and a gutter (gutter 204) interposed between the outlet and the connector connecting portion are provided above the connector connecting portion.

According to (3), the gutter is provided above the connector connecting portion, so that even if the seal portion of the refrigerant introduction unit or the refrigerant discharge unit breaks, the refrigerant flowing through the drain passage can be prevented from flowing into the connector connecting portion.

(4) In the electrical apparatus according to (2) or (3),
the housing is provided with a connector accommodating portion (connector accommodating portion 240) that accommodates the connector connecting portion,
an upper portion (upper portion 241) of the connector accommodating portion has a convex shape that is convex upward, and
a seal portion (seal portion 242) is provided between the connector connecting portion and the connector accommodating portion.

According to (4), the upper portion of the connector accommodating portion has a convex shape that is convex upward, so that even if the refrigerant flows into the connector connecting portion, the refrigerant can be introduced away from the connecting surface. Further, the seal portion is provided between the connector connecting portion and the connector accommodating portion, so that the refrigerant can be prevented from entering the connector accommodating portion.

(5) In the electrical apparatus according to any one of (1) to (4),
a ferrite core (ferrite core 84) is provided below the connector connecting portion.

According to (5), the noise of the cable can be reduced by the ferrite core by effectively using the dead space provided below the connector connecting portion.

(6) In the electrical apparatus according to any one of (1) to (5), the electrical device is supported by a sub-frame (sub-frame 54) having a rectangular shape, and
the connector connecting portion is covered with the sub-frame in a bottom view.

According to (6), an external impact is input to the sub-frame before to the electrical apparatus, so that the connector connecting portion can be protected from the impact. Further, the connector connecting portion is located higher than the sub-frame, so that the connector connecting portion can be protected from being flooded from below.

The invention claimed is:

1. An electrical apparatus comprising:
an electric circuit unit;
a cooling unit that cools the electric circuit unit;
a housing that accommodates the electric circuit unit and the cooling unit;
a refrigerant introduction unit that supplies a refrigerant to the cooling unit; and
a refrigerant discharge unit that discharges the refrigerant from the cooling unit,
wherein the refrigerant introduction unit and the refrigerant discharge unit are provided on opposite sides with the electric circuit unit being interposed therebetween in a horizontal direction,
wherein the housing is provided, on an inner side of an outer edge of the housing, with a connector connecting portion that is connected to a connector, and
wherein the connector connecting portion is provided below the cooling unit and closer to the refrigerant introduction unit or to the refrigerant discharge unit than the electric circuit unit in the horizontal direction.

2. The electrical apparatus according to claim 1,
wherein the connector connecting portion is disposed on a vertical wall provided on the inner side than the outer edge such that a connecting surface is directed in the horizontal direction.

3. The electrical apparatus according to claim 2,
wherein an outlet of a drain passage, and a gutter interposed between the outlet and the connector connecting portion are provided above the connector connecting portion.

4. The electrical apparatus according to claim 2,
wherein the housing is provided with a connector accommodating portion that accommodates the connector connecting portion,
wherein an upper portion of the connector accommodating portion has a convex shape that is convex upward, and
wherein a seal portion is provided between the connector connecting portion and the connector accommodating portion.

5. The electrical apparatus according to claim 1,
wherein a ferrite core is provided below the connector connecting portion.

6. The electrical apparatus according to claim 1,
wherein the electrical device is directly or indirectly supported by a sub-frame having a rectangular shape, and
wherein the connector connecting portion is covered with the sub-frame in a bottom view.

* * * * *